(12) United States Patent
Shouji et al.

(10) Patent No.: US 11,328,897 B2
(45) Date of Patent: May 10, 2022

(54) CHARGED PARTICLE BEAM DEVICE

(71) Applicant: Hitachi High-Tech Corporation, Tokyo (JP)

(72) Inventors: Minami Shouji, Tokyo (JP); Natsuki Tsuno, Tokyo (JP); Yasuhiro Shirasaki, Tokyo (JP); Muneyuki Fukuda, Tokyo (JP); Satoshi Takada, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 138 days.

(21) Appl. No.: 16/986,369

(22) Filed: Aug. 6, 2020

(65) Prior Publication Data

US 2021/0066029 A1 Mar. 4, 2021

(30) Foreign Application Priority Data

Aug. 30, 2019 (JP) .............................. JP2019-158941

(51) Int. Cl.
| | |
|---|---|
| *H01J 37/22* | (2006.01) |
| *H01J 37/26* | (2006.01) |
| *G01N 23/2251* | (2018.01) |
| *G01N 27/04* | (2006.01) |
| *G01N 27/22* | (2006.01) |
| *G01B 15/02* | (2006.01) |
| *G01N 23/2206* | (2018.01) |

(52) U.S. Cl.
CPC ............. *H01J 37/226* (2013.01); *G01B 15/02* (2013.01); *G01N 23/2206* (2013.01); *G01N 23/2251* (2013.01); *G01N 27/04* (2013.01); *G01N 27/22* (2013.01); *H01J 37/222* (2013.01); *H01J 37/26* (2013.01); *G01N 2223/07* (2013.01); *G01N 2223/20* (2013.01); *G01N 2223/40* (2013.01); *G01N 2223/507* (2013.01); *G01N 2223/633* (2013.01); *G01N 2223/646* (2013.01)

(58) Field of Classification Search
CPC ........ H01J 37/226; H01J 37/222; H01J 37/26; G01B 15/02; G01N 23/2206; G01N 23/2251; G01N 27/04; G01N 27/22; G01N 2223/07; G01N 2223/20; G01N 2223/40; G01N 2223/507; G01N 2223/633; G01N 2223/646
See application file for complete search history.

(56) References Cited

U.S. PATENT DOCUMENTS

2019/0013178 A1    1/2019 Zachreson et al.

FOREIGN PATENT DOCUMENTS

| CN | 109243953 A | 1/2019 |
| JP | 200816858 A | 1/2008 |
| JP | 2008252085 A | 10/2008 |

OTHER PUBLICATIONS

Office Action dated Jan. 5, 2022 in Taiwanese Application No. 109122866.
Office Action dated Feb. 21, 2022 in Korean Application No. 10-2020-0076845.

*Primary Examiner* — Nicole M Ippolito
*Assistant Examiner* — Hanway Chang
(74) *Attorney, Agent, or Firm* — Miles & Stockbridge, P.C.

(57) ABSTRACT

A charged particle beam device according to the present invention changes a signal amount of emitted charged particles by irradiating the sample with light due to irradiation under a plurality of light irradiation conditions, and determines at least any one of a material of the sample or a shape of the sample according to the changed signal amount.

17 Claims, 15 Drawing Sheets

$Q = CV$ $C = \varepsilon \dfrac{A}{d}$

A : AREA OF INSULATION
d : FILM THICKNESS OF INSULATION
ε : DIELECTRIC CONSTANT OF INSULATION $\sigma_{SiO_2} = 1.2 \quad \sigma_{Si} = 1.0$ $\underset{1.2 \times 1/4}{SiO_2} + \underset{1 \times 3/4}{Si} \underset{}{SiO_2} \underset{}{Si} = 0.3 + 0.75 = 1.05$

$SiO_2 + Si : Si = 1.05 : 1$

$\sigma_{SiO_2} = 2.4 \quad \sigma_{Si} = 0.7$ $\underset{2.4 \times 1/4}{SiO_2} : \underset{0.7 \times 3/4}{Si} \underset{}{SiO_2} \underset{}{Si} = 0.6 + 0.525 = 1.125$

$SiO_2 + Si : Si = 1.125 : 0.7$

| LIGHT INTENSITY [mW/cm$^2$] | Si | SiO$_2$ |
|---|---|---|
| 0 | 1.00 | 1.2 |
| 10 | 1.00 | 2.15 |
| 20 | 0.98 | 2.08 |
| 30 | 0.97 | 1.99 |
| · | · | · |
| · | · | · |
| · | · | · |
| 100 | 0.70 | 2.4 |
| · | · | · |
| · | · | · |
| · | · | · |
| 1000 | 0.7 | 2.4 |

| WAVELENGTH | a-Si | SiO$_2$ | Si |
|---|---|---|---|
| 200 | 0.97 | 0.04 | 0.99 |
| 210 | 0.97 | 0.05 | 0.96 |
| 220 | 0.96 | 0.08 | 0.92 |
| 230 | 0.96 | 0.11 | 0.91 |
| . | . | . | . |
| . | . | . | . |
| . | . | . | . |
| 1300 | 0.09 | 0.98 | 0.02 |

| ACCELERATION VOLTAGE | AREA A | AREA B |
|---|---|---|
| ACCELERATION VOLTAGE 1 | 1/2 | 1 |
| ACCELERATION VOLTAGE 2 | 1/10 | 3/4 |

FIG. 14

| LIGHT INTENSITY [mW/cm²] | SiN | MATERIAL Y | MATERIAL Z |
|---|---|---|---|
| 0 | 1.72 | 2.22 | 2.62 |
| 10 | 1.68 | 2.15 | 2.57 |
| 20 | 1.62 | 2.08 | 2.45 |
| 30 | 1.55 | 1.99 | 2.12 |
| ... | ... | ... | ... |
| 100 | 2.4 | . | . |
| ... | ... | ... | ... |
| 1000 | 0.21 | 0.21 | 0.81 |

| LIGHT INTENSITY [mW/cm²] | MATERIAL X | MATERIAL Y | MATERIAL Z |
|---|---|---|---|
| 0 | 1.48 | 1.67 | 2.62 |
| 10 | 1.32 | 1.45 | 2.57 |
| 20 | 1.20 | 1.32 | 2.45 |
| 30 | 1.08 | 1.99 | 2.12 |
| ... | ... | ... | ... |
| 100 | . | . | . |
| ... | ... | ... | ... |
| 1000 | 0.11 | 0.21 | 0.81 |

FIG. 19

CHARGED PARTICLE BEAM DEVICE

CROSS-REFERENCE TO RELATED APPLICATION

This application claims the priority of Japanese Patent Application No. 2019-158941 filed Aug. 30, 2019, which is incorporated herein by reference in its entirety.

BACKGROUND OF THE INVENTION

1. Field of the Invention

The present invention relates to a charged particle beam device that irradiates a sample with a charged particle beam.

2. Description of the Related Art

In a manufacturing process of semiconductor devices, in-line inspection measurement using a scanning electron microscope (SEM) is an important inspection item for the purpose of improving a yield. In particular, since a low acceleration SEM (LV SEM: Low Voltage SEM) using an electron beam having an acceleration voltage of several kV or less has a shallow penetration depth of the electron beam and an image abound in surface information is obtained, it is extremely useful for inspection and measurement of two-dimensional shapes such as a resist pattern in a lithography process and a gate pattern in a pre-process.

However, since organic materials of a resist and an antireflection film used in the lithography process have similar compositions to each other or silicon-based semiconductor materials constituting a transistor have similar compositions to each other, it is difficult to obtain a difference in secondary electron emission from the materials. Since a sample made of such a material has a low image contrast of the SEM, visibility of an ultrafine pattern and a defect of a semiconductor device deteriorates.

JP 2008-252085 A to be descried below describes a technique of acquiring a secondary electron image by irradiating a sample with an electron beam. In JP 2008-252085 A, the occurrence of the defect and a defect type are determined by comparing a contrast of the acquired secondary electron image with a reference image (see 0061 of JP 2008-252085 A). In JP 2008-252085 A, a database of a change in the contrast is prepared in advance, and a residual film thickness is estimated by referring to this database (see 0062 of JP 2008-252085 A).

SUMMARY OF THE INVENTION

For example, in a semiconductor device such as a memory device, an insulating film may be formed as a part of a device structure. It has been known that defects in an etching process when the insulating film is formed have a great influence on memory performance. For example, when the insulating film is thicker than a designed value due to an insufficient etching amount, a resistance value is likely to increase. Alternatively, a leak current is likely to increase due to overetching. Thus, there is a need for a technique for inspecting the residual amount of the insulating film.

The technique described in JP 2008-252085 A estimates the film thickness based on the contrast of the secondary electron image. However, as an implementation density of semiconductor devices increases, the insulating film becomes thinner. Accordingly, it is considered that a case where an interaction between a primary electron beam and a lower layer of the insulating film rather than an interaction between the primary electron beam and a surface insulating film becomes dominant increases. A contrast between the surface insulating film and the insulating film lower layer is lowered on the secondary electron image, and it is difficult to evaluate the residual amount of the insulating layer.

The present invention has been made in view of the above problems, and it is an object of the present invention to provide a charged particle beam device capable of clearly identifying a material and a shape of a sample surface even though a film thickness of a layer formed on the sample surface is thin and it is difficult to obtain a contrast of an observation image.

A charged particle beam device according to the present invention changes a signal amount of secondary charged particles between when light is applied and when the light is not applied by irradiating a sample with the light, and determines at least any one of a material of the sample and a shape of the sample according to the changed signal amount.

According to the charged particle beam device of the present invention, the material and shape of the sample surface can be clearly identified even when the film thickness of the sample surface layer is thin. Other problems, configurations, and effects of the present invention will be clarified by the following description of the embodiments.

BRIEF DESCRIPTION OF THE DRAWINGS

FIG. 14 is an example of a data table that describes an optical condition in which the amount of emitted secondary electrons due to the light irradiation is maximized;

FIG. 19 is an example of a GUI provided by the charged particle beam device.

DESCRIPTION OF THE PREFERRED EMBODIMENTS

First Embodiment

Figure 1:
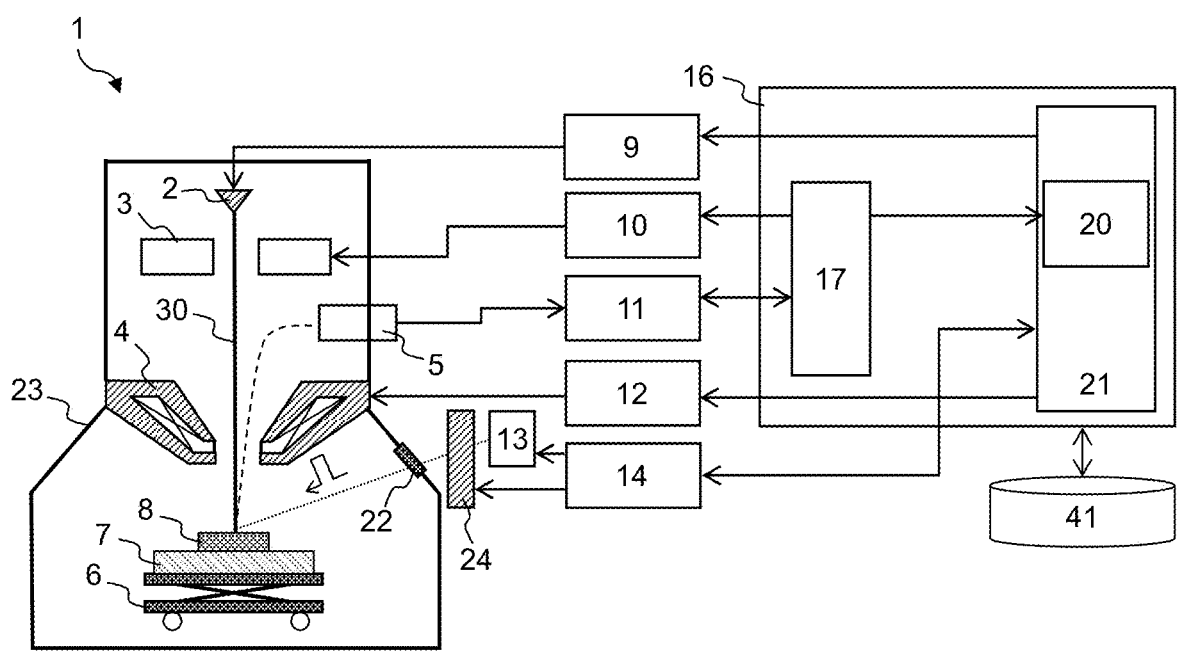
FIG. 1 is a configuration diagram of a charged particle beam device according to a first embodiment.

FIG. 1 is a schematic diagram of a charged particle beam device 1 according to a first embodiment of the present invention. The charged particle beam device 1 is a scanning electron microscope that acquires an observation image of a sample 8 by irradiating the sample 8 with an electron beam 30 (primary charged particles). The charged particle beam device 1 includes an electron optical system, a stage mechanism system, an electron beam control system, a light irradiation system, and a main console 16.

The electron optical system includes an electron gun 2, a deflector 3, an electron lens 4, and a detector 5. The stage mechanism system includes an XYZ stage 6 and a sample holder 7. The electron beam control system includes an electron gun control unit 9, a deflection signal control unit 10, a detection control unit 11, and an electron lens control unit 12. The light irradiation system includes a light source 13, a light control unit 14, a light irradiation unit 24, and an input setting unit 21. The main console 16 includes an image forming system and an input and output system. The image forming system includes a calculation unit 17 having a detection sampling function synchronized with the deflection signal. The input and output system includes an input setting unit 21 and a display unit 20. A storage unit 41 will be described below.

The electron beam 30 accelerated by the electron gun 2 is focused by the electron lens 4, and is applied to the sample 8. The deflector 3 controls an irradiation position of the electron beam 30 on the sample 8. The detector 5 detects secondary electrons (secondary charged particles) emitted from the sample 8 by irradiating the sample 8 with the electron beam 30. The input setting unit 21 is a functional unit used by a user who designates and inputs an acceleration voltage, an irradiation current, a deflection condition, a detection sampling condition, and an electron lens condition.

The light source 13 emits the light to be applied to the sample 8. The light source 13 is a laser capable of outputting a single wavelength or multiple wavelengths in an area in which an output wavelength ranges from ultraviolet to near infrared. The light emitted from the light source 13 is applied to the sample 8 provided in a vacuum through a glass window 22 provided in a device housing 23. The light control unit 14 controls a light parameter representing physical characteristics emitted by the light source 13. The user designates the light parameter for the light control unit 14 through the input setting unit 21. In the present invention, the light parameter includes parameters controllable by the light such as a polarization plane of light, a wavelength, an average irradiation amount, and a peak intensity.

Figure 2A:
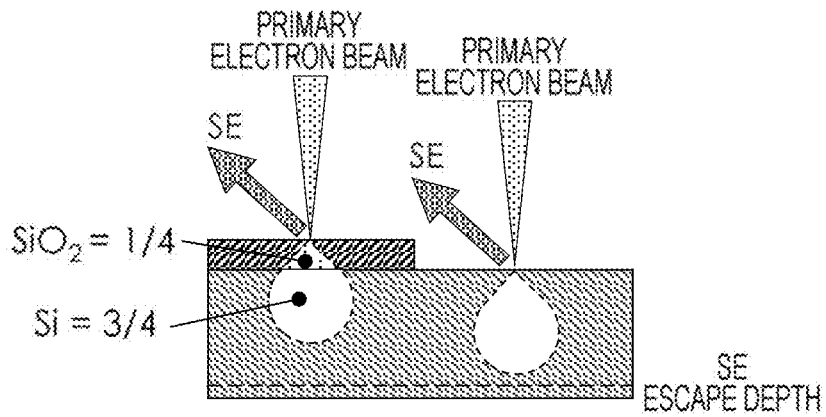
FIG. 2A is a schematic diagram illustrating an example of a sample in which an unnecessary $SiO_2$ insulating film remains on a Si substrate.

FIG. 2A is a schematic diagram illustrating an example of a sample in which an unnecessary $SiO_2$ insulating film remains on a Si substrate. An area in which secondary electrons are generated by applying the electron beam is represented by a dotted spherical surface. In a portion in which the insulating film is formed, it is assumed that the insulating film occupies a quarter of a thickness of the spherical surface and the Si substrate occupies the remaining three quarters. When the amount of emitted secondary electrons of Si is normalized as 1.0, the amount of emitted secondary electrons of $SiO_2$ is 1.2. These numerical values can be acquired in advance by experiments, for example.

Since the amount of emitted secondary electrons depends on a scattering position of the primary electrons, the amount of emitted secondary electrons also depends on a film thickness of a material. Thus, in the area in which the insulating film remains, it is considered that the secondary electrons are generated from the insulating film at a portion which is a quarter of the thickness of the spherical surface and the secondary electrons are generated from the Si substrate in the remaining three quarters. In addition, when the amount of emitted secondary electrons normalized for each material is considered, the amount of emitted secondary electrons from the portion at which the insulating film remains is $(1.2 \times 1/4) + (1.0 \times 3/4) = 1.05$. Thus, the signal amount of the secondary electrons is 1.05 times that of the portion at which the insulating film does not remain.

The portion at which the insulating film remains can be estimated based on a difference between the signal amount of the secondary electrons at the portion at which the insulating film remains and the signal amount of the secondary electrons at the portion at which the insulating film does not remain. A film thickness of the insulating film can be estimated based on the normalized amount of emitted secondary electrons (Si=1.0 and $SiO_2$=1.2 in this example). This is because the amount of emitted secondary electrons depends on the film thickness. However, the difference becomes smaller as the insulating film becomes thinner. This is because the secondary electrons generated from Si below the insulating film become dominant as the insulating film becomes thinner. Thus, it is increasingly difficult to estimate the film thickness as the film becomes thinner.

Figure 2B:
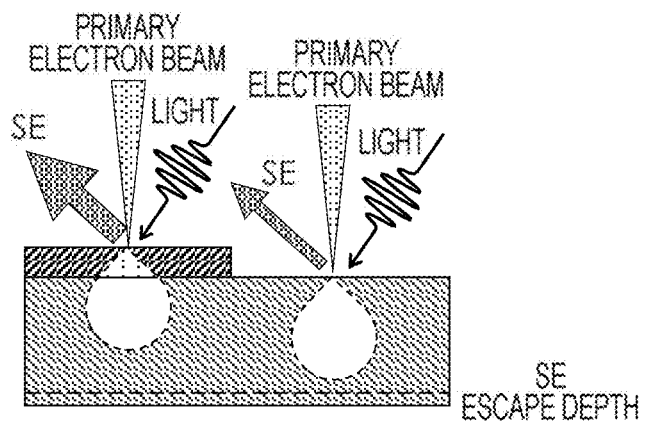
FIG. 2B is a schematic diagram illustrating an example in which secondary electrons are detected while applying light.

FIG. 2B is a schematic diagram illustrating an example in which the secondary electrons are detected while applying the light. The configuration of the sample is the same as that in FIG. 2A. However, the amount of emitted secondary electrons normalized for each material changes from that when the light is not applied by applying the light while applying the electron beam. In this example, when Si=1.0 in FIG. 2A is used as a reference, the amount of emitted secondary electrons of Si is 0.7 and the amount of emitted secondary electrons of $SiO_2$ is 2.4 by the irradiation of the light.

When the amount of emitted secondary electrons is calculated as in FIG. 2A, the amount of emitted secondary electrons from the portion at which the insulating film remains is $(2.4 \times 1/4) + (0.7 \times 3/4) = 1.125$. Thus, the signal amount of the secondary electrons is 1.6 times (=(1.125/0.7)) that of the portion at which the insulating film does not remain. That is, since the difference in the signal amount of the secondary electrons between the portion at which the insulating film remains and the portion at which the insulating film does not remain is larger than that when the light is not applied due to the light irradiation, it is possible to improve estimation accuracy of the film thickness even when the insulating film becomes thinner.

Whether or not the insulating film remains at a light irradiation position can be determined by whether or not the amount of emitted secondary electrons changes to a threshold value or more. For example, in FIG. 2B, since the signal amount of the secondary electrons is different by 1.6 times between the portion at which the insulating film remains and the portion at which the insulating film does not remain, it is determined that the insulating film remains. When the difference between both the portions is greater than or equal to the threshold value, the calculation unit 17 can determine that the insulating film remains at a portion at which the signal amount of the secondary electrons increases.

Figure 3:
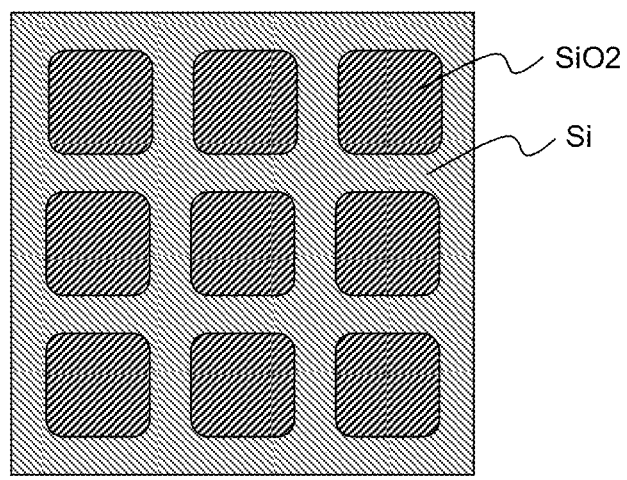
FIG. 3 illustrates material and structural information of an observed sample.

FIG. 3 illustrates material and structural information of the observed sample. The sample of $SiO_2$ laminated on Si used in FIGS. 2A and 2B is observed by using the present embodiment. This sample is a sample in which a thin film of $SiO_2$ is laminated on Si. Electron beam conditions for observing the sample are an acceleration voltage of 300 eV, an irradiation current of 30 pA, an imaging time of 100 nm/pixel, a magnification of 10,000 times, and light irradiation conditions are a wavelength of 650 nm, a light intensity of 100 mW/cm$^2$, and a pulse width of 30 psec.

Figure 4A:
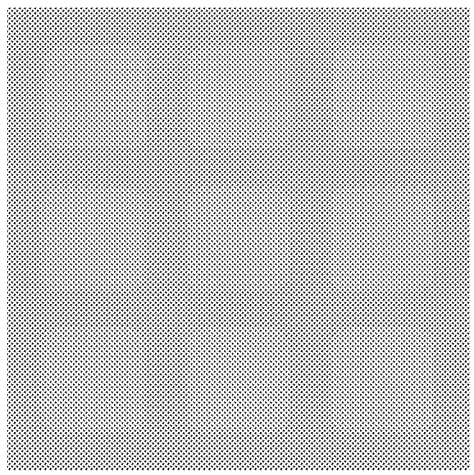
FIG. 4A illustrates a result of an SEM image captured only by electron beam irradiation.
Figure 4B:
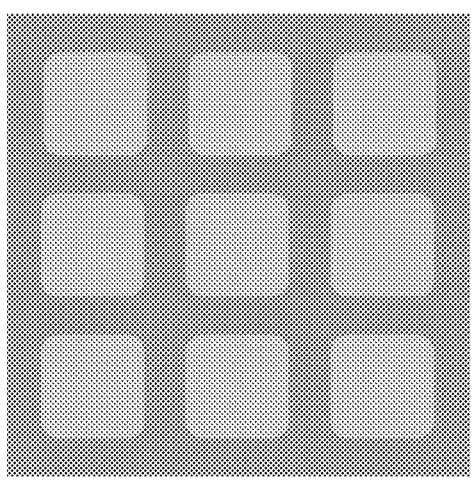
FIG. 4B illustrates an SEM image when light is applied.

FIG. 4A illustrates a result of an SEM image captured only by the electron beam irradiation. Since the difference in the amount of emitted secondary electrons between the Si portion and the $SiO_2$ portion is 1.05 times, a contrast between Si and $SiO_2$ is low. Meanwhile, FIG. 4B illustrates an SEM image when the light is applied. Since the amount of emitted secondary electrons of Si decreases to 0.7 times while the amount of emitted secondary electrons of $SiO_2$ increases to 2.4 times due to the light irradiation, the difference in the amount of emitted secondary electrons is 1.6 times, and is the difference in the amount of emitted secondary electrons of two materials is larger than that when the light is not applied. Thus, the contrast between Si and $SiO_2$ becomes higher as illustrated in FIG. 4B.

Figures 5, 6:
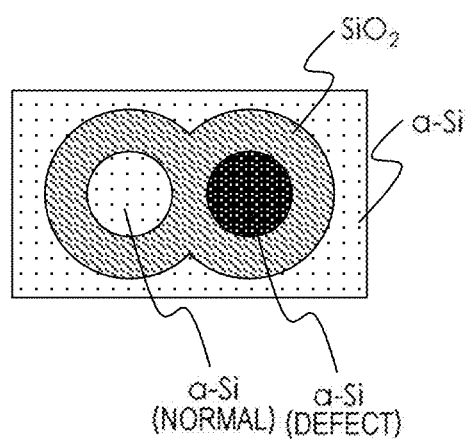
FIG. 5 is an example of data indicating a result obtained by obtaining the amount of emitted secondary electrons through an experiment.
FIG. 6 illustrates a sample used in a second embodiment.

FIG. 5 is an example of data indicating a result obtained by obtaining the amount of emitted secondary electrons through an experiment. The amount of emitted secondary electrons normalized for each material when the light is applied can be stored in the storage unit 41, as data (first data) that describes a result acquired through an experiment in advance. A table of the data may be as illustrated in FIG. 5. Since the amount of emitted secondary electrons for each material depends on the light parameter, it is desirable that the amount of emitted secondary electrons is described by the combination of the material and the light parameter (wavelength, average light irradiation amount, light intensity, and polarization plane). FIG. 5 illustrates a data table of the light intensity of the amount of emitted secondary electrons in a wavelength S. The material of the sample at the light irradiation position can be estimated by comparing this data with an actually measured value of the signal amount of the secondary electrons. For example, the calculation unit 17 estimates that the material corresponding to the signal amount is present at the portion at which the signal amount changes.

The calculation unit 17 can also estimate characteristics other than the position and the film thickness of the insulating film by using the first data. For example, when the position and the film thickness of the insulating film at the light irradiation position are known in advance and the amount of emitted secondary electrons is different from that described in the first data, a density of the insulating film at this portion is likely to be different from a reference value. Alternatively, the insulating film at this portion is likely to contain defects or impurities. This is because these defects and impurities are factors that change the amount of emitted secondary electrons.

When an electric resistance value or a capacitance of the insulating film is different from a specified value, the amount of emitted secondary electrons is likely to be different from that described in the first data. This is because these values are factors that change the amount of emitted secondary electrons. Accordingly, when the position and the film thickness of the insulating film at the light irradiation position are known in advance and the amount of emitted secondary electrons is different from that described in the first data, the calculation unit 17 can estimate the electric resistance value and the capacitance of the insulating film at this portion.

In view of the above description, the first data can describe the amount of emitted secondary electrons for at least any one combination of the density, the electric resistance value, and the capacitance in addition to the combination of the material and the light wavelength. Even though these values cannot be uniquely specified from the amount of emitted secondary electrons, it is considered that at least any one of these values can be determined to be abnormal.

First Embodiment: Conclusion

The charged particle beam device 1 according to the first embodiment increases the difference in the amount of emitted secondary electrons between the materials of the sample 8 by irradiating the sample 8 with the light while controlling the irradiation intensity of the light, and accordingly increases the difference in the signal amount of the secondary electrons between the portion at which the insulating film remains on the sample 8 and the portion at which the insulating film does not remain as compared with a case where the light is not applied. Thus, even though the insulating film becomes thinner by controlling the irradiation intensity of the light, it is possible to accurately estimate residue characteristics such as the position and the film thickness of the insulating film.

Second Embodiment

In the present embodiment, a charged particle beam device that controls the amount of emitted secondary electrons that changes according to a light absorption coefficient depending on the wavelength and detects a defect in a crystal structure of the same material that is difficult to be identified by merely controlling the amount of emitted secondary electrons by acceleration voltage control will be described. A configuration example of the charged particle beam device according to the present embodiment is the same as that of the first embodiment.

FIG. 6 illustrates a sample used in the present embodiment. In the present embodiment, a sample in which amorphous silicon (a-Si: Amorphous-Silicon) annealed with an oxide film is formed is used. When the amorphous silicon annealed with the oxide film is formed, a contrast between the materials can be formed by an acceleration voltage of a primary electron beam. However, in amorphous silicon having a different crystalline state, since a scattering distribution of the primary electron beam is close, it is difficult to obtain a clear contrast under the irradiation condition of the primary electron beam. However, an in-plane distribution is generated depending on a state of a furnace body for annealing, and the defect in the crystal structure of the amorphous silicon occurs partially even in the same plane. When the defect occurs, since electrical characteristics change and device performance deteriorates, it is important to measure the defect in the crystal structure. Thus, since the light has a difference in the light absorption coefficient at the irradiated portion depending on whether or not the defect in the crystal occurs, it is suitable for observing the partial difference in the crystal structure.

Since the light absorption coefficient is correlated with the increase in the amount of emitted secondary electrons, it is possible to measure the difference in the crystal structure that is difficult to evaluate with the electron beam alone by measuring the difference in the amount of emitted secondary electrons in each wavelength.

Figure 7:
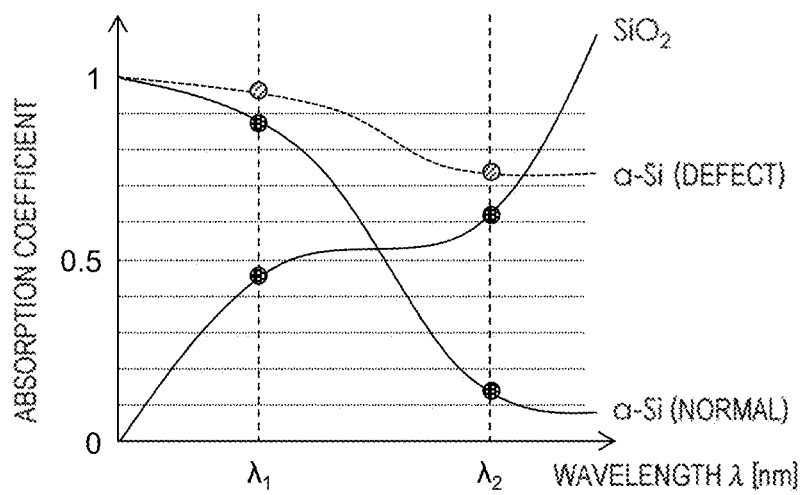
FIG. 7 illustrates a relationship between a wavelength $\lambda$ of light and an absorption coefficient for a material.

FIG. 7 illustrates a relationship between a wavelength $\lambda$, of the light and the absorption coefficient for the material. There is the correlation between the light absorption coefficient and the amount of emitted secondary electrons, and the amount of emitted secondary electrons increases as the light absorption coefficient increases. Thus, as a value of the light absorption coefficient becomes larger, the amount of emitted secondary electrons generated becomes larger. An absorption coefficient of the oxide film ($SiO_2$) is 0.48 in the wavelength whereas the absorption coefficient thereof is 0.62 in the wavelength $\lambda_2$. An absorption coefficient of normal amorphous silicon is 0.85 in the wavelength whereas the absorption coefficient thereof is 0.15 in the wavelength $\lambda_2$. An absorption coefficient of amorphous silicon having a defect is 0.95 in the wavelength whereas the absorption coefficient thereof is 0.75 in the wavelength $\lambda_2$. FIG. 7 can also be displayed on a GUI.

Figure 8A:
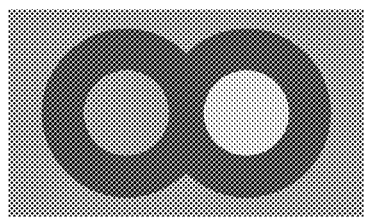
FIG. 8A illustrates an SEM image when the sample is irradiated in a wavelength $\lambda_1$.

FIG. 8A illustrates an SEM image when the sample is irradiated in the wavelength $\lambda_1$. The light absorption coefficient has a relationship of amorphous silicon (defect) >amorphous silicon (normal)>$SiO_2$, and image brightness of the SEM image also increases in the order of amorphous silicon (defect)>amorphous silicon (normal)>$SiO_2$.

Figure 8B:
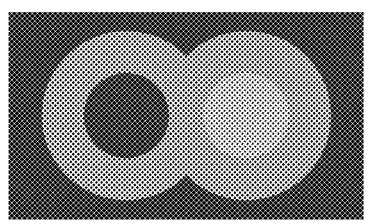
FIG. 8B illustrates an SEM image when the sample is irradiated in a wavelength $\lambda_2$.

FIG. 8B illustrates an SEM image when the sample is irradiated in the wavelength $\lambda_2$. Since the light absorption coefficient has a relationship of amorphous silicon (defect) >$SiO_2$>amorphous silicon (normal) in the wavelength $\lambda_2$, a brightness value of the image increases in the order of amorphous silicon (defect)>$SiO_2$>amorphous silicon (normal).

Figures 9, 10:
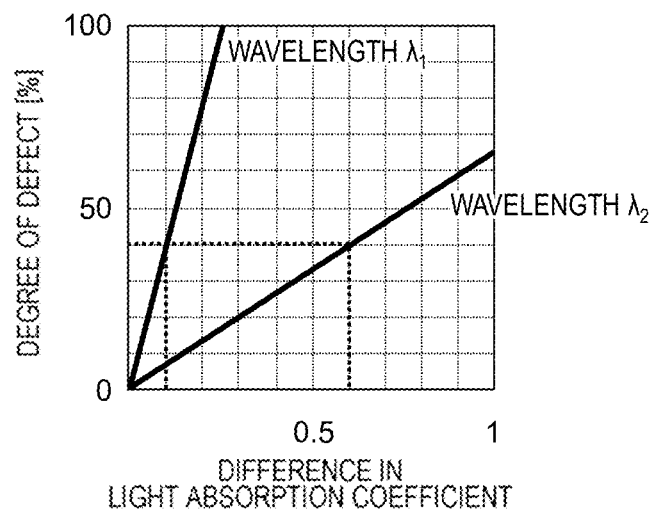
FIG. 9 illustrates a diagram in which a degree of defect is calculated from a difference in a light absorption coefficient between a defective portion of and a normal portion of amorphous silicon.
FIG. 10 is an example of data that describes an absorption coefficient of the material for each wavelength.

FIG. 9 illustrates a diagram illustrating a case where a degree of defect is calculated from the difference in the light absorption coefficient between a defective portion and a normal portion of the amorphous silicon. Since the difference in the light absorption coefficient between the defective portion and the normal portion of the amorphous silicon when the sample is irradiated in the wavelength $\lambda_1$ is 0.1, the degree of defect is 40%, and since the difference in the light absorption coefficient between the defective portion and the normal portion in the wavelength $\lambda_2$ is 0.6, the degree of defect is 40%. The degree of defect of the defective portion can be calculated by obtaining the difference in the light absorption coefficient between the defective portion and the normal portion from the relationship diagram of FIG. 9. The graph of FIG. 9 can be displayed on the GUI, and the calculated degree of defect can also be displayed.

FIG. 10 is an example of data that describes the absorption coefficient of the material for each wavelength. Wavelength conditions of the wavelengths $\lambda_1$ and $\lambda_2$ applied to the sample in the present embodiment are extracted such that the difference in the absorption coefficient of the material constituting the sample to be observed is maximized from the data table illustrated in FIG. 10. The data table of FIG. 10 may store, as data, a result obtained by actually measuring the light absorption coefficient in each wavelength, or may store a literature value. Although the data table of the light absorption coefficient and the wavelength of each material is used as an example in FIG. 10, a vertical axis may represent the amount of emitted secondary electrons. A horizontal axis may represent any parameter (wavelength, polarization plane, average irradiation amount, or light intensity) controllable by the light.

According to the present embodiment, the amount of emitted secondary electrons that changes according to the light absorption coefficient is controlled depending on the wavelength, and thus, it is possible to acquire information that reflects the defect in the crystal structure of the same material which is difficult to be identified by merely controlling the amount of emitted secondary electrons by the acceleration voltage control.

Third Embodiment

In the present embodiment, a charged particle beam device that evaluates a film thickness of a sample which is a sample having areas with different film thicknesses with high accuracy by controlling the change in the amount of emitted secondary electrons by the light irradiation and the acceleration voltage of the primary electron beam applied to the sample will be described. A configuration example of the charged particle beam device according to the present embodiment is the same as that of the first embodiment.

Figure 11A:
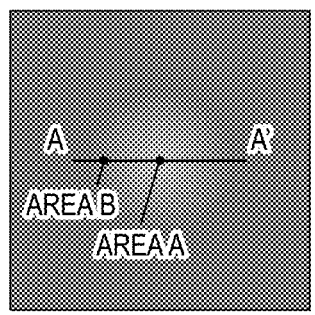
FIG. 11A illustrates a sample observed in a third embodiment.
Figure 11B:
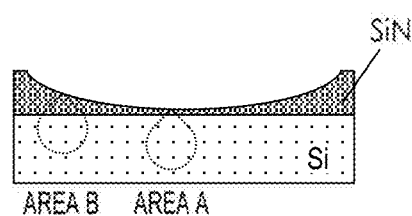
FIG. 11B illustrates a sample observed in the third embodiment.

FIGS. 11A and 11B illustrate samples observed in the present embodiment. These samples are samples in which SiN having different film thicknesses are deposited on an Si substrate.

Figures 12, 13:
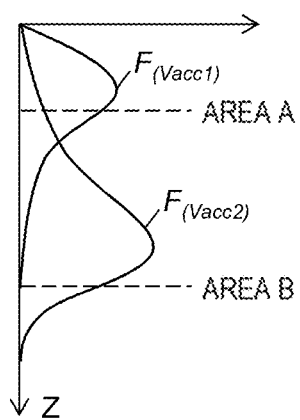
FIG. 12 illustrates scattering distributions when the sample of FIG. 11A is irradiated at an acceleration voltage 1 and an acceleration voltage 2.
FIG. 13 illustrates scattering rates of the acceleration voltage 1 and the acceleration voltage 2 in areas A and B in the sample of FIG. 12.

FIG. 12 illustrates scattering distributions when the sample of FIG. 11A is irradiated with an acceleration voltage 1 and an acceleration voltage 2, respectively. A horizontal axis of FIG. 12 represents the number of scattered particles, and a vertical axis represents a penetration depth. Lines of areas A and B in the diagram are film thicknesses of SiN in the areas A and B. A scattering rate in each area at each acceleration voltage can be obtained from the scattering distribution of the primary electrons. The scattering distribution between the materials may be calculated by a Monte Carlo simulation, or may be obtained from the scattering distribution of the primary electrons. Here, since the scattering distribution depends on the material and the acceleration voltage, it is necessary to calculate the scattering distribution for each condition of the material and the acceleration voltage. In the present embodiment, the scattering distribution at the acceleration voltage 1 is $F_{(Vacc1)}$ and the scattering distribution at the acceleration voltage 2 is $F_{(Vacc2)}$. A scattering rate $A_{A(Vacc1)}$ of the area A at the acceleration voltage 1 can be expressed by the following Equation 1, and a scattering rate $A_{B(Vacc1)}$ of the area B can be expressed by Equation 2.

[Equation 1]

$$A_{A(Vacc1)} = F_{(Vacc1)} - \int_0^{Z_A} \pi r_{(s)}^2 dZ \quad (1)$$

[Equation 2]

$$A_{B(Vacc1)} = F_{(Vacc1)} - \int_0^{Z_Z} \pi r_{(z)}^2 dZ \quad (2)$$

A scattering rate $A_{A(Vacc2)}$ of the area A at the acceleration voltage 2 can be expressed by Equation 3, and a scattering rate $A_{B(Vacc2)}$ of the area B can be expressed by Equation 4.

[Equation 3]

$$A_{A(Vacc2)} = F_{(Vacc2)} - \int_0^{Z_1} \pi r_{(Z)}^2 dZ \quad (3)$$

[Equation 4]

$$A_{B(Vacc2)} = F_{(Vacc2)} - \int_0^{Z_2} \pi r_{(Z)}^2 dZ \quad (4)$$

FIG. 13 illustrates the scattering rates of the acceleration voltage 1 and the acceleration voltage 2 of the areas A and B in the sample of FIG. 12. FIG. 14 is an example of a data table that describes an optical condition in which the amount of emitted secondary electrons due to the light irradiation is maximized. The data table of FIG. 14 may store, as data, a result obtained by actually measuring the amount of emitted secondary electrons in each wavelength, acceleration voltage, and light intensity, or may store a literature value. The conditions extracted at the current time are an acceleration voltage 1 of 300 eV, an acceleration voltage 2 of 600 eV, a light irradiation intensity of 400 kW/cm$_2$, and an irradiation wavelength of 387 nm, and the amount of emitted secondary electrons due to the light irradiation at this time is 2.4 times. The amount of emitted secondary electrons without light irradiation is 1.1 times.

When the light is not applied, since the scattering rate under the condition of the acceleration voltage 1 in the area A is (½×1.2=0.6) and the scattering rate under the condition of the acceleration voltage 2 in the area A is (⅒×1.2=0.12), the difference between the acceleration voltages 1 and 2 is 0.48. Subsequently, since the scattering rate under the condition of the acceleration voltage 1 in the area A is (1×1.2=1.2) and the scattering rate under the condition of the acceleration voltage 2 in the area B is (¾×1.2=0.9), the difference between the acceleration voltages 1 and 2 is 0.3. Thus, the difference in the amount of emitted secondary electrons between the areas A and B is 0.18.

The difference in the amount of emitted secondary electrons between the areas A and B when the light is applied is obtained. When the light is applied, since the scattering rate under the condition of the acceleration voltage 1 in the area A is (½×2.6=1.3) and the scattering rate under the condition of the acceleration voltage 2 in the area A is (⅒×2.6=0.26), the difference between the acceleration voltages 1 and 2 is 1.04. Subsequently, the scattering rate under the condition of the acceleration voltage 1 in the area B is (1×2.6=2.6), and the scattering rate under the condition of the acceleration voltage 2 in the area B is (¾×2.6=1.95), the difference between the acceleration voltages 1 and 2 is 0.65. Thus, the difference in the amount of emitted secondary electrons between the areas A and B is 0.39. The difference in the amount of emitted secondary electrons due to the light irradiation is improved by 2.16 times in the areas A and B. Since the difference in the amount of emitted secondary electrons due to a difference in the film thickness increases by the light irradiation, it is possible to inspect the difference in the film thickness with higher sensitivity.

Figure 20:
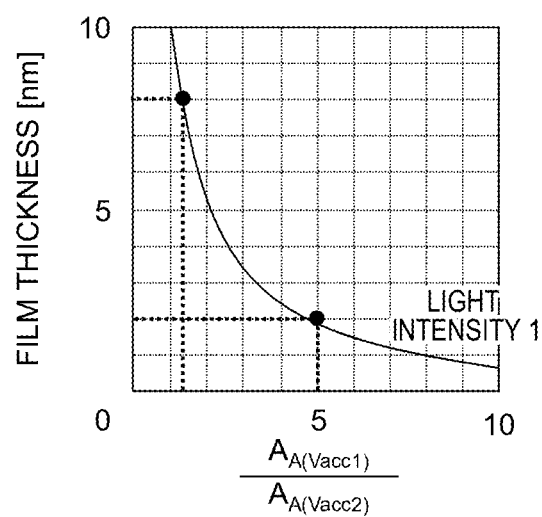
FIG. 20 illustrates a diagram in which a film thickness from a ratio of the amount of emitted secondary electrons due to irradiation under a plurality of light conditions.

As illustrated in FIG. 20 to be described below, since a ratio (for example, $A_{AVacc1}/A_{AVacc2}$) of the amount of emitted secondary electrons due to whether or not the light is applied and the irradiation under different light conditions is correlated with the film thickness, it is possible to estimate the film thickness from the ratio of the amount of emitted secondary electrons. At this time, since the light absorption coefficient is different for each parameter of the light to be applied and each acceleration voltage of the electron beam, a data table that stores the light absorption coefficient or the amount of emitted secondary electrons for each material, each light parameter, and each acceleration voltage is required. This data table may include actually measured values, or may include literature values.

As described above, according to the present embodiment, it is possible to evaluate the film thickness of the sample which is the sample having areas with different film thicknesses with high accuracy by controlling the change in the amount of emitted secondary electrons due to the light irradiation and the acceleration voltage of the primary electron beam applied to the sample.

Fourth Embodiment

In a fourth embodiment of the present invention, a method of calculating the film thickness by using a static elimination effect due to the light irradiation will be described. Since a configuration of the charged particle beam device 1 is the same as that of the first embodiment, a configuration newly mounted in the fourth embodiment will be mainly described below.

Figure 15:
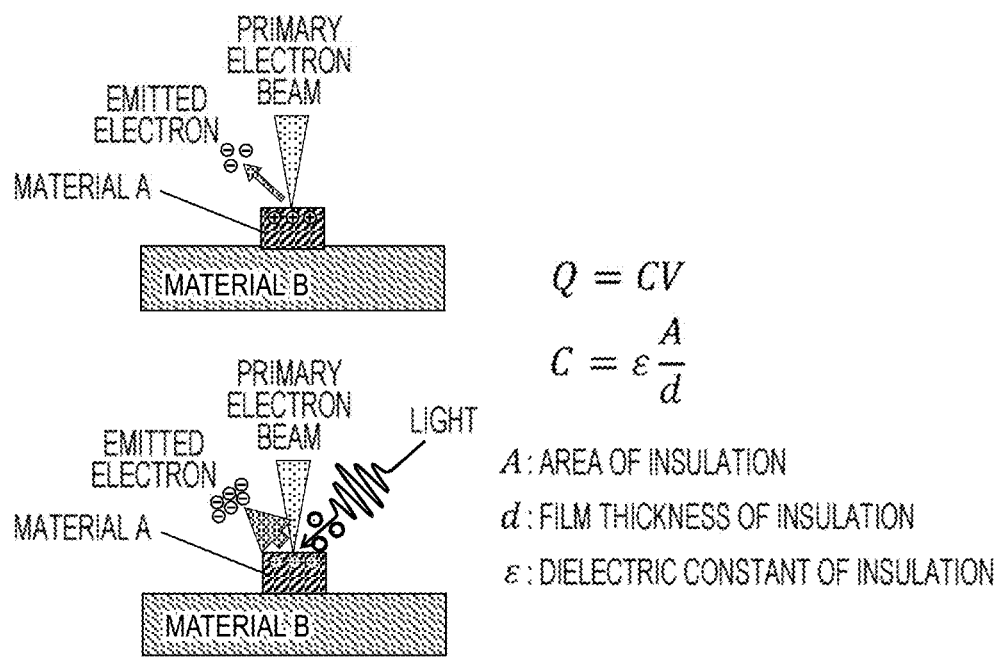
FIG. 15 is a schematic diagram illustrating a scene in which the sample is destaticized by irradiating the sample with the light.

FIG. 15 is a schematic diagram illustrating a scene in which the sample is destaticized by irradiating the sample with the light. Here, an example in which an insulating film made of a material A is formed on a material B is illustrated. When the insulating film is irradiated with the primary electron beam (primary charged particles), the insulating film is electrified, and secondary electrons (secondary charged particles, SE) are emitted from the insulating film. Since the amount of emitted secondary electrons increases by irradiating the sample with the primary electron beam and the light, the amount of destaticized charges due to the emission of the secondary electrons exceeds the amount of electrified charges, and the insulating film can be destaticized.

It is assumed that the amount of electrified charges Q of the insulating film is represented by a capacitance C and a potential V of the insulating film. Since the capacitance C is inversely proportional to the film thickness of the insulating film, it is considered that the amount of destaticized charges (that is, the amount of emitted secondary electrons) is correlated with the film thickness of the insulating film. In the fourth embodiment, due to the use of this principle, the signal amount of the secondary electrons increases by the light irradiation, and the film thickness of the insulating film is acquired. A specific method will be described below.

Figure 16:
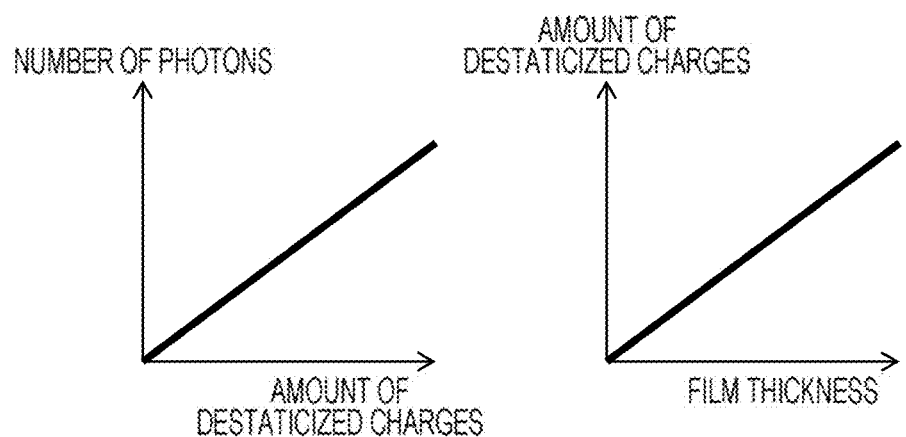
FIG. 16 is a schematic diagram illustrating a correspondence relationship between the number of photons, the amount of destaticized charges, and a film thickness.

FIG. 16 is a schematic diagram illustrating a correspondence relationship between the number of photons, the amount of destaticized charges, and the film thickness. When the sample is irradiated with the light, the secondary electrons are emitted from the sample. The sample electrified by the electron beam irradiation is destaticized. At this time, the number of photons of the light applied and the amount of destaticized charges have a correspondence relationship for each material of the sample. A left diagram of FIG. 16 is one example. This correspondence relationship is stored, as data (second data) that describes a result acquired through an experiment in advance in the storage unit 41. The amount of destaticized charges and the film thickness have a correspondence relationship for each material of the sample as described in FIG. 15. A right diagram of FIG. 16 is one example. This correspondence relationship is similarly acquired in advance, and data that describes this correspondence relationship (third data) is stored in the storage unit 41.

Figure 17:
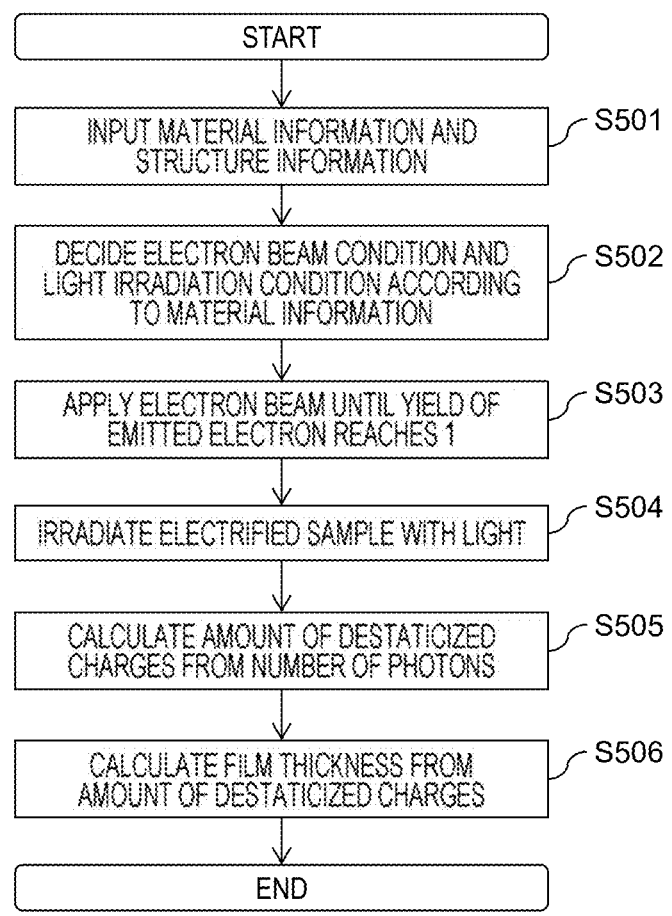
FIG. 17 is a flowchart for describing a procedure for calculating a film thickness of an insulating film by a charged particle beam device according to a fourth embodiment.

FIG. 17 is a flowchart for describing a procedure for calculating the film thickness of the insulating film by the charged particle beam device 1 according to the fourth embodiment. It is assumed that a position of the insulating film on a surface of the sample 8 is known in advance. Each step of FIG. 17 will be described below.

FIG. 17: Step S501

The user inputs information regarding the material and structure of the sample from the input setting unit 21. The structure of the sample is, for example, information regarding a surface shape and coordinates (coordinates of the position at which the insulating film is disposed) of the sample. Since the correspondence relationship described in FIG. 16 is different for each material of the sample, the material of the sample is further designated in this step, and the correspondence relationship of FIG. 16 corresponding to this designated material is specified. When the correspondence relationship of FIG. 16 also depends on the light wavelength, each data of FIG. 16 may be provided for each combination of the light wavelength and the material.

FIG. 17: Step S502

The irradiation condition (for example, acceleration voltage) of the primary electron beam suitable for electrifying the sample is different depending on the material. Thus, the calculation unit 17 decides the irradiation condition of the primary electron beam according to the material input in S501. Similarly, the light irradiation condition (for example, light wavelength, pulse width, pulse period, and pulse amplitude) suitable for destaticizing the sample is different depending on the material. Thus, the calculation unit 17 decides the light irradiation condition according to the material input in S501.

FIG. 17: Step S503

The electron gun 2 irradiates the sample 8 with the electron beam 30 until the signal amount of the secondary electrons emitted from the sample 8 is saturated (until a signal yield reaches a normalized standard value (=1)). The irradiation position is a position at which the insulating film of which the film thickness is measured is formed. When the signal amount of the secondary electrons is saturated, the sample 8 is completely electrified by the electron beam 30. The reason why the sample 8 is completely electrified is that it is difficult to digitize the amount of electrified charges of the sample when an electrified state is incomplete and it is accordingly difficult to confirm the correspondence relationship between the amount of electrified charges (or the amount of destaticized charges) and the film thickness.

FIG. 17: Step S504

The light source 13 irradiates the completely electrified sample 8 with the light. The irradiation position is the same as that in S503. Since the emission of the secondary electrons is promoted by the light irradiation, the secondary electrons are emitted from the sample 8 completely electrified in S503, and the sample 8 is destaticized.

FIG. 17: Step S505

The calculation unit 17 calculates the number of photons contributing to completely destaticize the charges from the sample 8. For example, the amount of light absorbed by the sample 8 can be calculated from a difference between the amount of light incident on the sample 8 and the amount of light reflected from the sample 8. The calculation unit 17 can calculate the number of photons contributing to the static elimination by converting the amount of light into the number of photons. The calculation unit 17 calculates the amount of charges (the amount of destaticized charges) removed by the light irradiation by referring to the data (second data) on the left diagram of FIG. 16 by using the number of photons.

FIG. 17: Step S506

The calculation unit 17 calculates the film thickness at the light irradiation position by referring to the data (third data) on the right diagram of FIG. 16 by using the amount of destaticized charges obtained in S505.

Although it has been described that the film thickness is calculated by using the fact that there is the correspondence relationship between the number of photons and the amount of destaticized charges, there is a similar correspondence relationship between the amount of destaticized charges and the amount of fluctuation in the surface potential of the sample 8 due to the light irradiation. Thus, instead of or in combination with the correspondence relationship illustrated in the left diagram of FIG. 16, a correspondence relationship between the amount of fluctuation in the surface potential and the amount of destaticized charges may be obtained in advance, and data that describes this correspondence relationship may be stored in the storage unit 41. In this case, in S505, the amount of destaticized charges is calculated by using the data.

Fourth Embodiment: Conclusion

The charged particle beam device 1 according to the fourth embodiment acquires the correspondence relationship (second data and third data) between the number of photons and the film thickness of the insulating film necessary for destaticizing the sample 8 in advance, and estimates the film thickness of the insulating film by referring to the corresponding relationship by using the actually measured value of the number of photons when the sample is destaticized by the light irradiation. The number of photons can be acquired by measuring the amount of applied light. That is, according to the fourth embodiment, the film thickness of the insulating film can be accurately estimated without accurately measuring the amount of emitted secondary electrons due to the light irradiation. Similarly, when the surface potential of the sample 8 is used, there is an advantage that the film thickness of the insulating film can be accurately estimated without accurately measuring the amount of emitted secondary electrons.

The charged particle beam device 1 according to the fourth embodiment completely electrifies the sample 8 by irradiating the sample with the electron beam 30 until the signal amount of the secondary electrons is saturated and then destaticizes the sample 8 by the light irradiation. Thus, since the amount of electrified charges of the sample 8 can be accurately digitized, the number of photons necessary for destaticizing the sample can also be accurately measured. Accordingly, the estimation accuracy of the film thickness can be improved.

Fifth Embodiment

It has been described in the fourth embodiment that the film thickness is estimated by using the number of photons necessary for destaticizing the sample on the assumption that the film thickness is unknown. In contrast, when the film thickness is known, the number of photons necessary for destaticizing the sample can also be obtained from the film thickness. It is considered that it is possible to determine whether or not the actually measured value of the number of photons necessary for destaticizing the sample by the number of photons is normal. Thus, in the fifth embodiment of the present invention, an example in which it is determined whether or not a film quality is normal by comparing the actually measured value and the known value of the number of photons will be described. Since a configuration of the charged particle beam device 1 is the same as that of the first embodiment, the configuration newly mounted in the fifth embodiment will be mainly described below.

Figure 18:
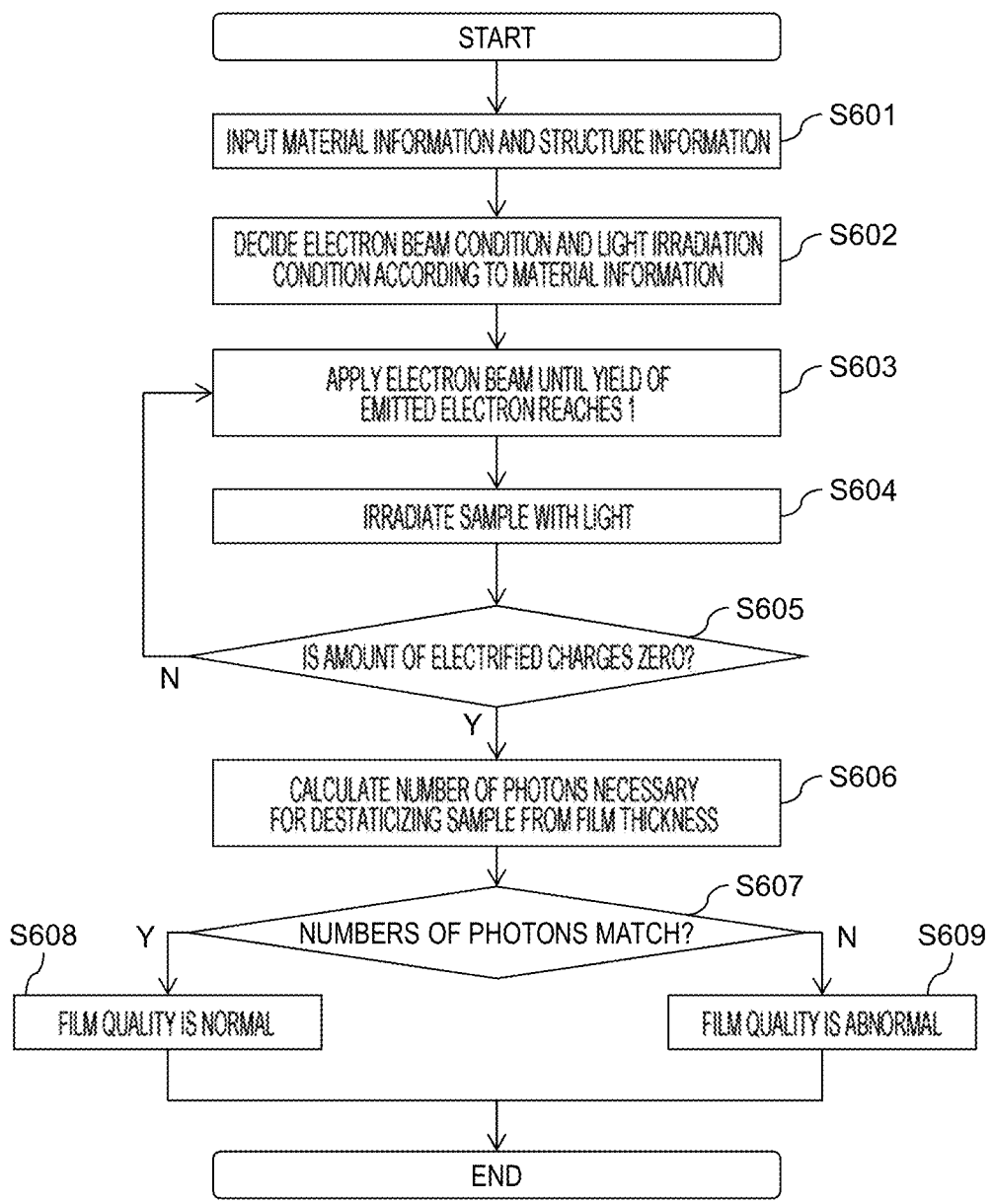
FIG. 18 is a flowchart for describing a procedure for determining film quality of an insulating film in a charged particle beam device according to a fifth embodiment.

FIG. 18 is a flowchart for describing a procedure for determining the film quality of the insulating film in the charged particle beam device 1 according to the fifth embodiment. It is assumed that a position of the insulating film on a surface of the sample 8 is known in advance. Each step of FIG. 18 will be described below.

FIG. 18: Steps S601 and S602

The user inputs information regarding the material and structure of the sample from the input setting unit 21. In this step, the film thickness of the insulating film is also input in addition to the information input in S601. S602 is the same as S502. For example, the film thickness can be acquired by obtaining a result measured by another inspection device.

FIG. 18: Steps S603 to S605

Similarly to S503, the electron gun 2 irradiates the sample 8 with the electron beam 30 until the signal amount of the secondary electrons emitted from the sample 8 is saturated (S603). The light source 13 irradiates the sample 8 with the light (S604). When the amount of electrified charges of the sample 8 does not reach zero, the light irradiation condition changes, the processing returns to S603, and the same processing is repeated (S605: N). When the amount of electrified charges of the sample 8 reaches zero, the processing proceeds to S606 (S605: Y). When the processing proceeds to S606, the calculation unit 17 calculates the number of photons necessary for causing the amount of electrified charges of the sample 8 to zero. The calculation procedure may be similar to that of S505, for example.

FIG. 18: Step S605: Supplement 1

When the irradiation of the sample 8 with the electron beam 30 is started in S603, the yield of the secondary electrons gradually decreases. When the sample 8 is completely electrified, the yield reaches 1, and the signal amount is saturated. Thereafter, when the sample 8 is irradiated with the light, the signal amount of the secondary electrons increases again, and is recovered to the level at a point of time when the irradiation of the electron beam 30 is started. The calculation unit 17 can determine that the amount of electrified charges of the sample 8 reaches zero at this point of time. It is not constantly necessary to destaticize the sample to a level that is exactly equal to the level at the point of time when the irradiation of the electron beam 30 is started, and the amount of destaticized charges may reach a level at which the destaticizing of the sample can be regarded as being substantially completed. That is, the amount of electrified charges (or the amount that can be converted into the amount of electrified charges) reaches an appropriate threshold value.

FIG. 18: Step S605: Supplement 2

In the flowchart described in FIG. 17, whether or not the amount of electrified charges of the sample 8 reaches zero may be determined by the same procedure as this step, and when the amount of electrified charges does not reach, S503 to S504 may be repeated.

FIG. 18: Step S606

The calculation unit 17 acquires the amount of destaticized charges of the insulating film having this film thickness by referring to the data (third data) illustrated in the right diagram of FIG. 4 by using the film thickness input in S601. The calculation unit 17 further acquires the number of photons necessary for destaticizing the insulating film by referring to the data (second data) in the left diagram of FIG. 4 by using the amount of destaticized charges.

FIG. 18: Steps S607 to S609

The calculation unit 17 compares the actually measured value of the number of photons calculated in S605 with the number of photons acquired by referring to the data in S606 (S607). When these values match, it is possible to determine that the film quality of the insulating film is normal (S608). This is because the actually measured value matches the specified value acquired through the experiment in advance. When these values do not match, it is determined that the film quality of the insulating film has some abnormalities (S609).

FIG. 18: Step S609: Supplement

A cause by which two numbers of photons do not match in S607 is considered as a problem that the amount of charges electrified in the insulating film fluctuates. For example, there may be problems such as an abnormality of the material density of the insulating film, defects or impurities contained in the insulating film, an abnormality of the electric resistance value of the insulating film, and an abnormality of the capacitance of the insulating film. The calculation unit 17 can output a determination result indicating that at least any one of these problems is present as a cause of an abnormality of the film quality.

Fifth Embodiment: Conclusion

In the charged particle beam device 1 according to the fifth embodiment, when the film thickness of the insulating film is known in advance, it is determined whether or not the film quality of the insulating film is normal depending on whether or not the number of photons necessary for destaticizing the sample 8 matches the specified value. Accordingly, the film quality of the insulating film can be accurately determined without accurately measuring the amount of emitted secondary electrons as in the second embodiment.

Sixth Embodiment

Figure 19:
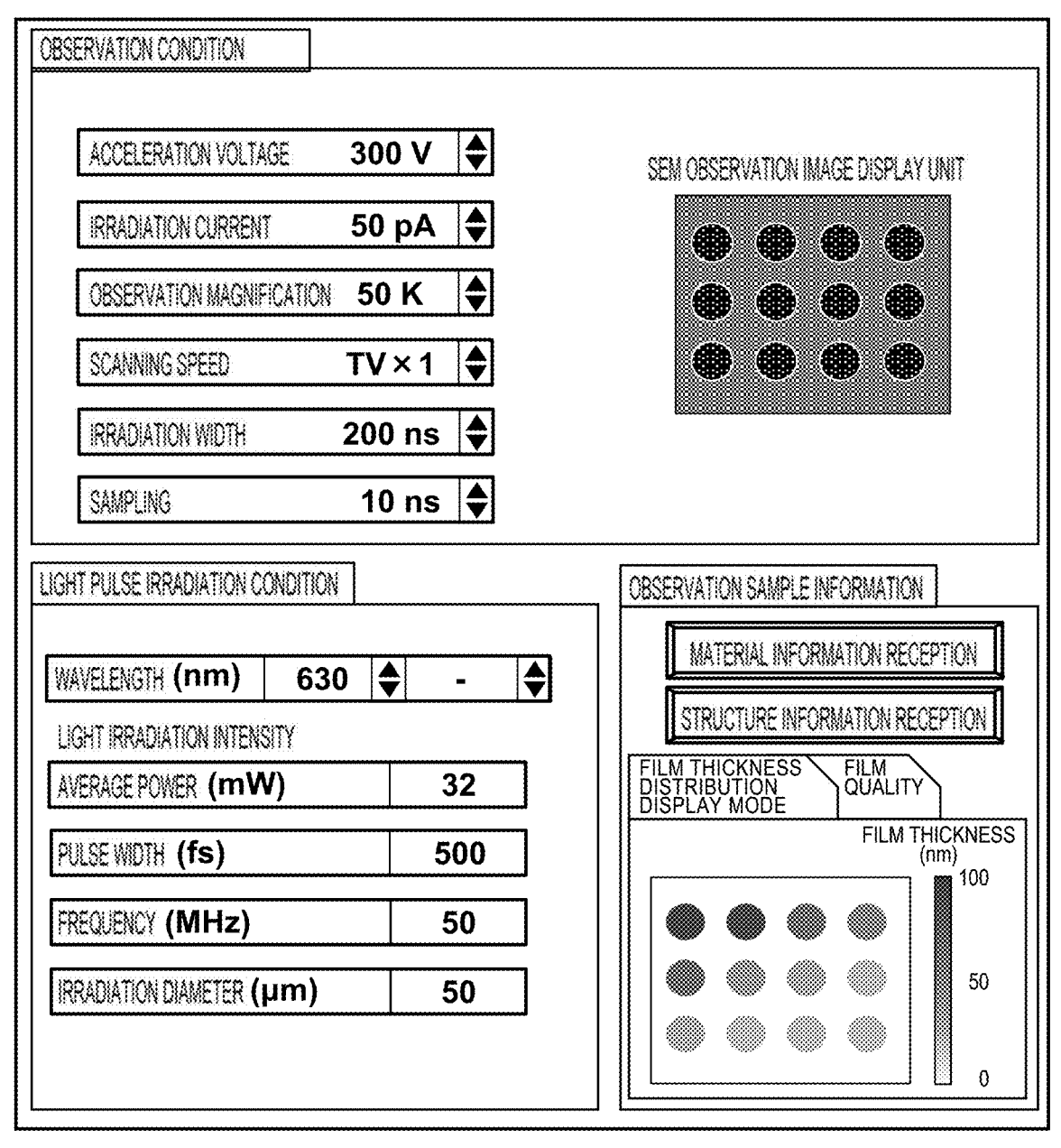

FIG. 19 is an example of a graphical user interface (GUI) provided by the charged particle beam device 1. The calculation unit 17 can present the determination result described in each of the first to fifth embodiments on the GUI as illustrated in FIG. 17. For example, the GUI can be provided as a screen display on the display unit 20.

About Modification Examples of Present Invention

The present invention is not limited to the aforementioned embodiments, and includes various modification examples. For example, the aforementioned embodiments are described in detail in order to facilitate easy understanding of the present invention, and are not limited to necessarily include all the described components. Some of the components of a certain embodiment can be substituted into the components of another embodiment, and the components of another embodiment can be added to the component of a certain embodiment. In addition, the components of another embodiment can be added, removed, and substituted to, from, and into some of the components of the aforementioned embodiments.

In the aforementioned embodiments, each functional unit of the charged particle beam device 1 may be controlled by the calculation unit 17, or may be controlled by other functional units. The calculation unit 17 can be constituted by hardware such as a circuit device that implements the function, or can be constituted by executing software that implements the function by a calculation device such as a central processing unit (CPU).

Although it has been described in the aforementioned embodiments that the scanning electron microscope acquires the observation image of the sample 8 by irradiating the sample 8 with the electron beam 30, the present invention is also applicable to other charged particle beam devices. That is, the present invention can be used in a charged particle beam device that uses a change in the amount of emitted secondary charged particles due to the light irradiation.

Although it has been described in the aforementioned embodiments that the characteristics such as the film thickness of the insulating film remaining on the surface of the sample 8 are determined, characteristics of other material layers formed on the surface of the sample 8 can be determined by the present invention. That is, when the amount of emitted secondary electrons due to the light irradiation is greatly different between a portion at which the material layer is formed and a portion other than the portion, it is possible to determine whether or not the material layer is present by the present invention.

In the aforementioned embodiments, the light control unit 14 may control any one or more parameters of an average power of a laser output from the light source 13, a pulse peak intensity, a pulse width, an irradiation period of a pulse, an irradiation area of the laser, a wavelength, and polarization.

What is claimed is:

1. A charged particle beam device that irradiates a sample with a charged particle beam, the device comprising:
   a charged particle source that irradiates the sample with primary charged particles;
   a light source that emits light applied to the sample;
   a detector that detects secondary charged particles generated from the sample by irradiating the sample with the primary charged particles;
   a calculation unit that analyzes the sample by using the secondary charged particles detected by the detector;
   a light irradiation control system that is capable of setting at least one or more of a condition in which the light source applies the light, a first light irradiation condition, and a second light irradiation condition;
   a detection unit that detects the secondary charged particles emitted from the sample by the charged particle beam; and
   an image processing unit that forms a secondary charged particle image based on a detection signal of the secondary charged particles,
   wherein
   the light source applies the light under the first light irradiation condition and the second light irradiation condition,
   the light source detects a change in a signal amount of the secondary charged particles detected by the detector between the first light irradiation condition and the second light irradiation condition by irradiating the sample with the light, and
   the calculation unit determines at least any one of a material of the sample or a shape of the sample according to the changed signal amount.

2. The charged particle beam device according to claim 1, wherein
   the calculation unit determines a feature of the sample from the secondary charged particle image obtained under the first light irradiation condition and the secondary charged particle image obtained under the second light irradiation condition.

3. The charged particle beam device according to claim 2, wherein
   the detector acquires a first signal amount of the secondary charged particles when a first portion of the sample is irradiated with the primary charged particles and the light,
   the detector acquires a second signal amount of the secondary charged particles when a second portion of the sample is irradiated with the primary charged particles and the light, and
   the calculation unit determines the material of the sample in each of the first portion and the second portion by comparing the first signal amount with the second signal amount.

4. The charged particle beam device according to claim 2, wherein
   the detector acquires a first signal amount of the secondary charged particles when a first portion of the sample is irradiated with the primary charged particles and the light,
   the detector acquires a second signal amount of the secondary charged particles when a second portion of the sample is irradiated with the primary charged particles and the light, and
   the calculation unit determines at least any one of a film thickness and film quality of the sample in each of the first portion and the second portion according to a ratio of the first signal amount with the second signal amount when the first signal amount and the second signal amount are different by a determination threshold value or more.

5. The charged particle beam device according to claim 4, wherein
   the calculation unit determines, as the film quality, at least any one of a density of the material, whether or not defects or impurities of the sample occur, an electric resistance value of the sample, and a capacitance of the sample.

6. The charged particle beam device according to claim 1, wherein
   the light irradiation control system controls any one or more parameters of an average power of a laser, a pulse peak intensity, a pulse width, an irradiation period of a pulse, an irradiation area of the laser, a wavelength, and polarization.

7. The charged particle beam device according to claim 1, further comprising:
   a storage unit that stores first data that describes signal amount characteristics indicating the amount of change in the signal amount by applying the light for each combination of a material of the sample and a wavelength of the light,
   wherein the calculation unit determines at least any one of a material of the sample or a shape of the sample at a portion irradiated with the light by comparing the signal amount characteristics described in the first data with the signal amount of the secondary charged particles detected by the detector.

8. The charged particle beam device according to claim 7, wherein
   the first data describes an irradiation signal amount indicating the signal amount when the light is applied for each material of the sample, the detector acquires a first signal amount of the secondary charged particles when a first portion of the sample is irradiated with the primary charged particles and the light, the detector acquires a second signal amount of the secondary charged particles when a second portion of the sample is irradiated with the primary charged particles and the light, and the calculation unit determines the material of the sample in each of the first portion and the second portion and calculates a thickness of the sample by referring to the irradiation signal amount described in the first data and referring to a ratio of the first signal amount to the second signal amount.

9. The charged particle beam device according to claim 1, further comprising:

a storage unit that stores second data which describes a correspondence relationship between the number of photons of the light applied to the sample by the light source and the amount of destaticized charges removed from the sample by applying the light and third data which describes a correspondence relationship between the amount of destaticized charges and a film thickness of the sample, wherein the calculation unit calculates the number of photons by using the amount of change in the signal amount by irradiating the sample with the light, and acquires the amount of destaticized charges by referring to the second data by using the number of photons, and the calculation unit acquires the film thickness by referring to the third data by using the amount of destaticized charges acquired by referring to the second data.

10. The charged particle beam device according to claim 9, wherein the charged particle source irradiates the sample with the primary charged particles until the signal amount of the secondary charged particles emitted from the sample is saturated, the light source removes charges of the sample electrified by the primary charged particles by irradiating the sample with the light in a state in which the signal amount of the secondary charged particles is saturated, and the calculation unit acquires the amount of destaticized charges removed from the sample by applying the light by the light source after the signal amount of the secondary charged particles is saturated.

11. The charged particle beam device according to claim 9, wherein the calculation unit calculates the number of photons by using the amount of change in surface potential of the sample by irradiating the sample with the light instead of using the amount of change in the signal amount by irradiating the sample with the light.

12. The charged particle beam device according to claim 11, wherein the calculation unit determines whether or not the sample is normal by determining at least any one of a density of the material, whether or not defects or impurities of the sample occur, an electric resistance value of the sample, and a capacitance of the sample.

13. The charged particle beam device according to claim 9, wherein the storage unit stores the second data and the third data for each combination of the material of the sample and a wavelength of the light, the calculation unit receives a destination input for designating the material of the sample, and the calculation unit acquires the film thickness by referring to the second data corresponding to the material of the sample designated by the designation input and the third data corresponding to the material of the sample designated by the designation input.

14. The charged particle beam device according to claim 1, further comprising:

a storage unit that stores second data which describes a correspondence relationship between the number of photons of the light applied to the sample by the light source and the amount of destaticized charges removed from the sample by applying the light and third data which describes a correspondence relationship between the amount of destaticized charges and a film thickness of the sample, wherein the calculation unit receives a designation input for designating the film thickness of the sample, the calculation unit acquires the amount of destaticized charges by referring to the third data by using the film thickness designated by the designation input, and acquires the number of photons of the light by referring to the second data by using the acquired amount of destaticized charges, and the calculation unit determines whether or not the sample is normal by comparing an actually measured value of the number of photons of the light necessary until charges of the sample are equal to or less than a threshold value with the number of photons acquired by referring to the second data.

15. The charged particle beam device according to claim 14, wherein the charged particle source irradiates the sample with the primary charged particles until the signal amount of the secondary charged particles emitted from the sample is saturated, the light source irradiates the sample with the light until charges of the sample electrified by the primary charged particles are equal to or less than the threshold value in a state in which the signal amount of the secondary charged particles is saturated, and the calculation unit acquires, as the actually measured value, the number of photons applied to the sample by the light source from when the signal amount of the secondary charged particles is saturated to when the charges of the sample electrified by the primary charged particles are equal to or less than the threshold value.

16. The charged particle beam device according to claim 15, wherein the calculation unit acquires an initial value of the signal amount of the secondary charged particles at a point of time when the charged particle source starts to irradiate the sample with the secondary charged particles, and when the signal amount of the secondary charged particles does not reach the initial value even though the light source irradiates the sample with the light, the charged particle source irradiates the sample with the primary charged particles again until the signal amount of the secondary charged particles is saturated, and the light source irradiates the sample with the light again until the charges of the sample are equal to or less than the threshold value.

17. The charged particle beam device according to claim 1, wherein the sample is made of a semiconductor material, and
the calculation unit determines a position and a film thickness of an insulating film present on a surface of the sample according to the changed signal amount.

* * * * *